United States Patent [19]

Inamasu et al.

[11] 4,197,434

[45] Apr. 8, 1980

[54] TELEPHONE EXCHANGE APPARATUS

[75] Inventors: Mituo Inamasu, Yokohama; Kazuo Takehara, Kyoto; Yoshio Sakata, Tokyo; Hiroshi Yoshikawa, Fujisawa; Satoshi Matsumoto, Ashigarakami; Akihiro Kawakami; Haruyuki Nakabayashi, both of Yokohama; Yosihiro Takeda, Kawasaki, all of Japan

[73] Assignees: Hitachi, Ltd.; Nippon Telegraph and Telephone Public Corporation, both of Japan

[21] Appl. No.: 820,648

[22] Filed: Aug. 1, 1977

[30] Foreign Application Priority Data

Aug. 2, 1976 [JP] Japan .................................. 51-91364

[51] Int. Cl.² .......................... H04Q 1/10; H04Q 1/14; H02B 1/04
[52] U.S. Cl. ...................................... 179/98; 312/201; 312/223; 361/428
[58] Field of Search ..................... 179/91 R, 98, 1 PT, 179/1 PC, 9.1 R, 97, 184, 186; 361/334, 336, 338, 391, 394, 428; 312/199, 200, 223, 250, 320, 201

[56] References Cited

U.S. PATENT DOCUMENTS

| | | | |
|---|---|---|---|
| 2,140,376 | 12/1938 | Anderson | 361/428 |
| 2,173,101 | 9/1939 | Fiedler | 361/338 |
| 2,363,327 | 11/1944 | Hodgkins et al. | 361/428 |
| 2,999,904 | 9/1961 | Lohs et al. | 179/98 |
| 3,088,054 | 4/1963 | Meyer | 361/338 |
| 3,118,021 | 1/1964 | Alexandersson et al. | 179/91 R |
| 3,335,326 | 8/1967 | Bonin et al. | 361/428 |
| 3,450,950 | 6/1969 | Tarrats | 179/98 |
| 3,652,806 | 3/1972 | Nakagami et al. | 179/98 |
| 3,711,053 | 1/1973 | Drake | 179/91 R |
| 3,755,716 | 8/1973 | Yoshii et al. | 361/391 |
| 3,818,283 | 6/1974 | Ward | 361/391 |

FOREIGN PATENT DOCUMENTS

1501975  9/1966  France .................................. 179/91 R

OTHER PUBLICATIONS

IEEE Transactions on Communications and Electronics; Nov. 1964; vol. 83, No. 75; p. 664.

H. Fletcher and R. Hickson; "Conversion Units for Telephone Signalling Systems;" Systems Technology; Nov. 1977, No. 27, pp. 15-21.

*Primary Examiner*—Bernard Konick
*Assistant Examiner*—Randall P. Myers
*Attorney, Agent, or Firm*—Craig and Antonelli

[57] ABSTRACT

A transportable telephone exchange apparatus which includes small capacity telephone exchange facilities which are divided into a plurality of containers for transportation to an installation site by boat or by vehicle, has an improved frame packing density within the frame and is constructed to facilitate maintenance.

12 Claims, 21 Drawing Figures

TELEPHONE EXCHANGE APPARATUS

LIST OF THE PRIOR ART REFERENCES (37 CFR 1.56 (a))

The following references are cited to show the state of the art:
U.S. Pat. No. 2,999,904 LOHS & et al. IEEE TRANSACTIONS ON COMMUNICATIONS AND ELECTRONICS VOL. 83, No. 25, Nov. 1964 U.S. Pat. No. 3,652,806 U.S. application Ser. No. 715,721 YOSHIKAWA et al.

The present invention relates to a transportable telephone exchange apparatus.

Prior arts and the present invention will be described in detail with reference to the accompanying drawings, in which.

A communication system in which telephone exchange facilities are housed in a transportable container which is transported to a field by a tractor with a dolly and installed thereat has been known.

Heretofore, with telephone exchange facilities of the cross-bar type, the main components of the exchange include electromagnetic parts, such as cross-bar relays and wire springs relays, and discrete parts, such as capacitors and diodes. Accordingly, these components can be mounted in a given size frame and hence a housing system described later has been adopted to house them in a transportable container.

Figure 1:
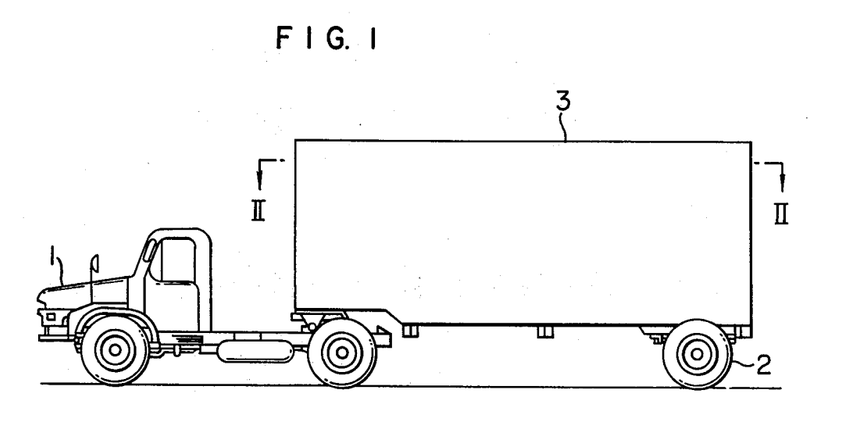
FIG. 1 is a side elevational view illustrating one form of transportable telephone exchange container.

Referring to FIG. 1, a transportable telephone exchange apparatus according to the present invention is generally designated by reference numeral 3 and is shown as being transported on a road to a destination for installation. In the illustrated embodiment, the transportable telephone exchange apparatus 3 has its front part connected with a tractor 1 and its rear part provided with a dolly 2. After the transportation to the destination for installation, the transportable telephone exchange apparatus 3 is slightly lifted by a suitable lifting means and the tractor 1 and the dolly 2 are disconnected from the apparatus 3. Then, the upward pressure applied by the lifting means is released to lower the apparatus 3 onto a preformed concrete foundation.

Figure 2:
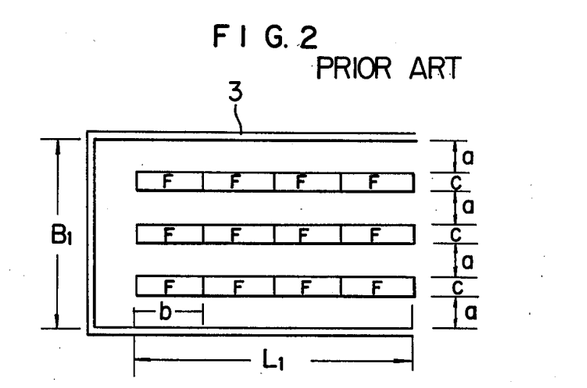
FIG. 2 is a cross-sectional view taken substantially along a line II—II in FIG. 1, illustrating a conventional arrangement of frames within the container.

In one type of conventional transportable telephone exchange apparatus, frames are arranged in series in a plurality of parallel lines in the longitudinal direction within the container as shown in FIG. 2. Immediately in front and behind of each of the frames F, spacing a is to be provided to allow an attendant to perform assembling, maintenance and inspection. This gives rise to the disadvantage that a large floor space must be for the communication apparatus within the container.

Figure 3:
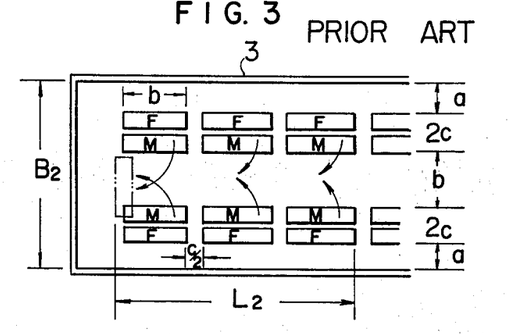
FIG. 3 is a cross-sectional view taken substantially along a line II—II in FIG. 1, illustrating another conventional arrangement of frames.

Referring to FIG. 3, which shows another example of the conventional arrangement of the frames within the container, the frames are paired with each pair including two different frames which are disposed back to back in such a manner that one frame F of the paired frames is fixed on the floor of the container while the other M is pivotable about an end thereof. The pairs of frames are arranged in series along opposite inner sides of the container such that the pivotable ones of the frames are disposed face to face in spaced relation with each other with a space b therebetween accommodating the pivotal movement of only one of the opposing frame pairs at a time. The required spacing b, however, is greater than the radius of rotation of the pivotable frame M, with the result that the spacing needed in this arrangement is only about 10% less than that required in the arrangement of FIG. 2.

Figure 4:
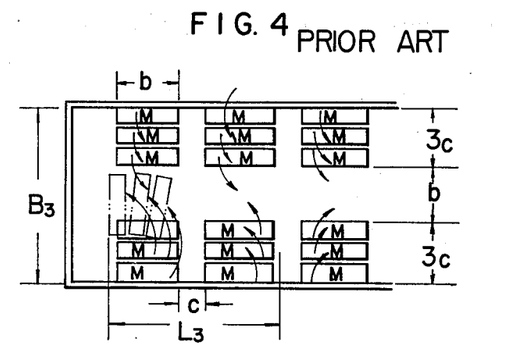
FIG. 4 is a cross-sectional view taken along the line II—II in FIG. 1, illustrating another conventional arrangement of frames.

In FIG. 4, a plurality of frame groups each including at least three pivotable frames with a common pivoting axis are arranged immediately adjacent to the inner side walls of the movable or fixed container in such a manner as to achieve symmetric formation with respect to a longitudinal center line of the container, while at the same time providing a central spacing b which allows the pivotal movement of either one of the opposing frame groups by approximately 90 degrees at a time. In this way, the required inner spacing of the container can be reduced by about 50% as compared with the arrangement shown in FIG. 2.

The spacings required in the arrangements shown above will be compared below using the symbols indicated in the drawings.

By way of example, three arrangements discussed above each including 12 frames will be compared with each other with the arrangement of FIG. 2 being taken as a standard.

The space required to accommodate 12 frames of communication apparatus in the arrangement of FIG. 1 is $B_1 \times L_1$ which is equal to $$(4a+3c) \cdot 4b \tag{1}$$

while the space required to accommodate the same number of frames in the arrangement of FIG. 3 is $b_2 \times l_2$ which is equal to $$(2a+b+4c) \cdot (3b+1.5c) \tag{2}$$

Further, the arrangement of FIG. 4 requires the space of $B_3 \times L_3$ which is equal to $$(b+6c) \cdot (2b+2c) \tag{3}$$

In order to facilitate the comparison, the numeric values 2, 3 and 1 are selected for the dimensions a, b and c, respectively, with the result that the FIGS. 132, 155.5 and 72 are obtained for the respective arrangements. The approximate ratio for the required spaces for the three arrangements is 1 to 0.9 to 0.5. It is thus apparent that the arrangement of FIG. 4 requires only about half of and two thirds of the space required for the arrangements of FIGS. 2 and 3, respectively.

In the prior art arrangements discussed above, the exchange apparatus is of the cross-bar type in which the size of the frames is normalized. Accordingly, it is relatively easy to provide a common pivoting axis to allow pivotal movement over 90 degrees in one pivotal direction. However, as the electronization of the telephone exchange apparatus proceeds, the construction of the frames has been considerably changed and it has become difficult to effectively accommodate the frames within the container of the prior art construction. Furthermore, when the container is also normalized for transportation by boat, the prior art arrangements described above are inconvenient to attain the high density accommodation of the exchange apparatus in the container, although the above arrangements facilitate maintenance.

It is an object of the present invention to provide a telephone exchange apparatus in which stationary frames, such as a central processing unit which forms a part of a stored program controlled electronic exchange and which stores various programs and data and processes those data, a speech path unit having the function of interconnecting subscriber lines and trunks, a power supply unit, an input/output device and an announcing unit, and movable frames, such as a line link frame and a trunk link frame are accommodated in opposing relation with a common maintenance path being interposed between the stationary and movable frames whereby the maintenance path can be commonly used for the maintenance of both stationary and movable frames in order to allow maintain the limitation of the size of the container within a standard.

It is a second object of the present invention to provide a telephone exchange apparatus in which the movable frames are movable transversely to the maintenance path arranged in front thereof and each of a group of movable frames is juxtaposed with a high density leaving a spacing therebetween required for the movement of the movable frame whereby the frame accommodation efficiency is improved.

It is a third object of the present invention to provide a telephone exchange apparatus in which cables to be connected to the movable frames are taken from the back sides of the movable frames and relayed through cable receiving members in order to prevent the spring action of the cables from being directly transmitted to the movable frames.

It is a fourth object of the present invention to provide a telephone exchange apparatus in which upper and lower rails for guiding the movement of the movable frames have a length approximately equal to a longitudinal width (length) of the movable frame with the upper rail also serving as a cable rack.

According to the present invention there is provided a transportable telephone exchange apparatus having a rack for fixing cables on an inner wall of a container whereby interframe cables are distributed and wired through said rack.

The telephone exchange apparatus, particularlly a transportable telephone exchange apparatus, is used as a small capacity telephone exchange facility or emergency telephone exchange facility in the case of a disaster because of its mobility. Like other vehicles which are transported on public roads, such vehicles are restricted by law with respect to the maximum permissible length, width and height thereof. As a result, higher packing density than that required in the usual electronic apparatus is necessary. The high packaging density telephone exchange apparatus of the present invention will be described first with respect to cable wiring in comparison with the prior art.

A prior art transportable telephone exchange apparatus has predetermined interconnection by cables arranged in cable racks above movable frames 3 having wheels 2 which frames are arranged in a container in book shelf manner. Thus, in the prior art cable wiring, since the cables are concentrated above the frames, a substantial space is required for the cables. This not only imparts a restriction to the height of the frame but also increases the number of frames and the number of interframe cables required to accommodate a given amount of instruments and components in the container. Furthermore, it poses a problem of access and workability because the cables extend toward the ceiling of the container. In addition, as the transistorization of the instruments proceeds, a reduction of the signal propagation time is required. For example, an instrument located far from the cable rack, such as a lower right end instrument in a frame, has a very long wiring distance. This has been a problem in increasing the operation speed of the apparatus.

In light of the above, according to the present invention, the cables are wired on walls of the container whereby the use of higher frames is permitted, the wiring operation of the interframe cables is facilitated and the cable length is minimized.

Figure 7A:
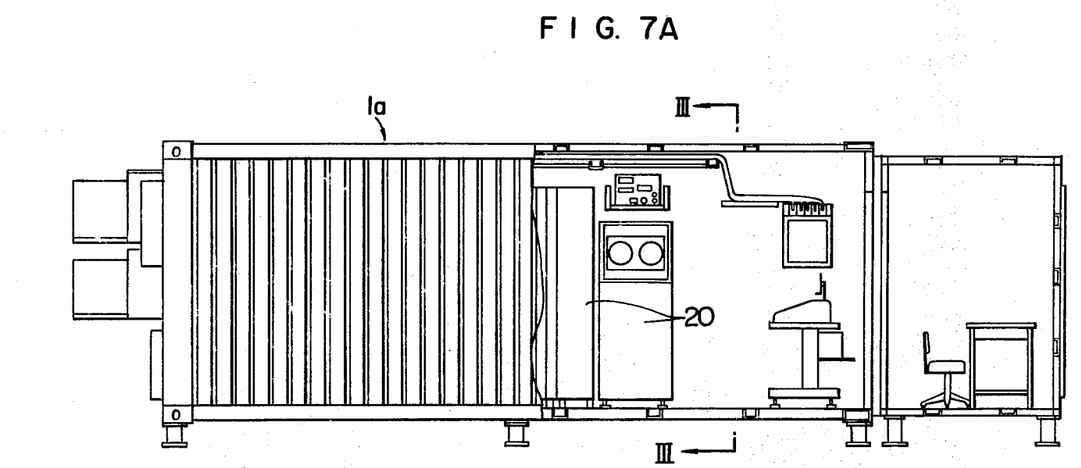
FIG. 7A is a side elevational view, partly broken away, of a transportable container which forms a part of the transportable telephone exchange apparatus.
Figure 8:
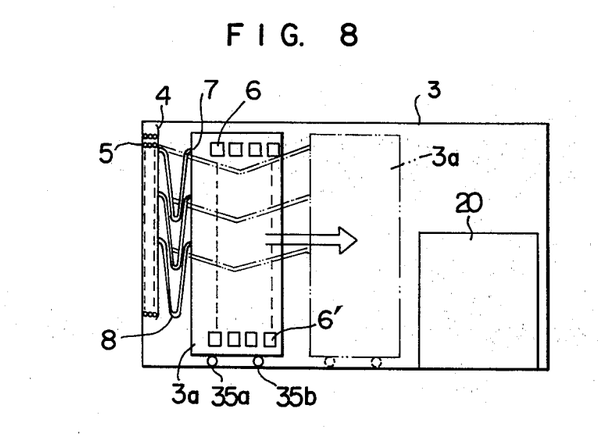
FIG. 8 is a sectional view taken along a line III—III in FIG. 7A, illustrating one embodiment of cable wiring in the present invention.

FIG. 8 is a sectional view taken along a line III—III in FIG. 7A, illustrating an embodiment of the cable wiring arrangement according to the present invention. Interframe cables 5 extend in and are fixed by a cable rack 4 mounted on a wall, and cables 8 which extend between the rack 4 and a cable entrance 7 have sufficient length to allow movement of the frame 3a.

With this arrangement of cable wiring, the height of the frame is not restricted by the cable rack and the cable unlike the prior art apparatus and the frame height can be sufficiently high. This allows higher packing density, a reduction of the number of frames and the number of cables as well as the length of cable. Further, since the cables are wired on the wall, the accessibility thereof is improved. Moreover, the length of the cables to instruments 6 and 6' mounted in the frame uniform and can be shorter than that of the prior art apparatus, and the signal propagation time can be reduced. In this manner, a high speed, high packing density and inexpensive apparatus can be provided.

Figure 9:
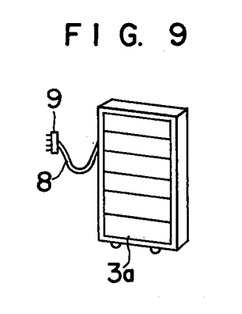
FIG. 9 is a perspective view illustrating one embodiment of a frame having connector coupled cables in accordance with the present invention.
Figure 10:
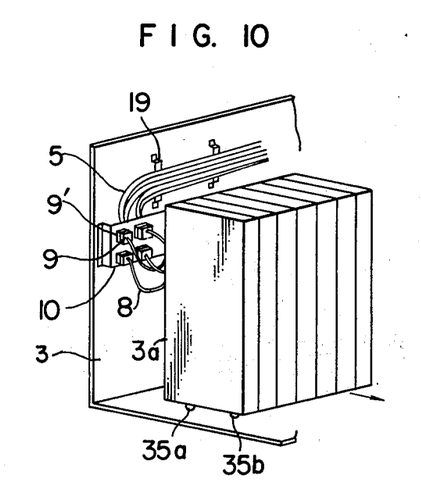
FIG. 10 is a perspective view illustrating arrangement of a plurality of frames shown in FIG. 9 in the container.

In addition, by connecting the interframe cables 5 and the movable cables 8 through connectors, the operability and the economy are further improved. FIGS. 9 and 10 show another embodiment of the cable wiring assembly using connectors in accordance with the present invention. In FIGS. 9 and 10, the interframe cables 5 are held by cable supports 19 mounted on the wall of the container 3 and the ends of the cables are connected to connectors 9' mounted on a connector mount 10 attached to the container 3. The movable cables 8' having sufficient length to allow extension thereof have their ends connected to connectors 9. With this arrangement, the interframe cables 5 are connected to the connector 9' before the frame 3a is accommodated in the container, and the connectors 9 and 9' are plugged to each other to complete electrical connection after the frame 3a has been accommodated in the container 3.

In the prior art, the cables previously wired in the container are connected to a terminal board (not shown) mounted on the frame. This wiring operation requires much time. In addition, it takes a long time to form the movable cables into U shape (sagging shape). On the other hand, in the arrangement shown in FIGS. 9 and 10, the operability is improved because the movable cables 8 can be connected to the frame 3a before the frame is accommodated in the container 3. Since the movable cables 8 are bent each time the frame 3a is moved in the direction of an arrow shown in FIG. 10 or in the opposite direction, it is not desirable from the point of view of durability to use communication interoffice cable. Instead, expensive cables which will not be damaged by bending must be used. In the arrangement of the present invention, such expensive cables are required only for the movable cable 8 which are relatively short.

A rail structure of the present invention which is useful to attain the transportable telephone exchange apparatus having improved operability, safety for operation and flexibility of frame arrangement is now explained in comparison with the prior art.

In a prior art rail structure, rails for guiding the movement of the movable frame are arranged above and below the frame and the upper and lower rails extend across interframe paths between adjacent frames. Thus, the upper rail blocks the illumination effect of a loop light mounted on the ceiling of the container while the lower rail renders walking by the attendant difficult and lowers the operability. The above disadvantage occurs even when the frames 3a are arranged on one side of the container.

Figure 11A:
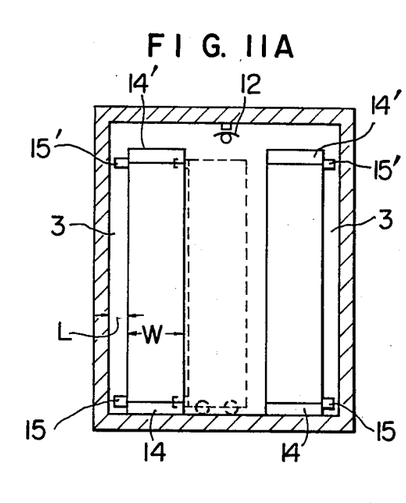
FIG. 11A is a sectional view illustrating one embodiment of a rail structure according to the present invention.
Figure 11B:
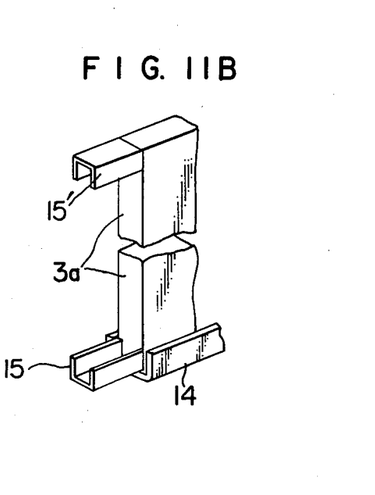
FIG. 11B is a perspective view, in an enlarged scale, showing a portion of the frame shown in FIG. 11A.

As shown in FIGS. 11A and 11B, according to the present invention, the length of the lower and upper rails 14 and 14' is selected to be substantially equal to the width W of the frame 3a in the direction of draw, and adaptors 15 and 15' are provided at upper and lower ends on the side of the frame opposite to the draw side, as shown in FIG. 11B, to prevent the tipping of the frame when the frame is drawn.

When the frame 3 is drawn, the adaptors 15 and 15' are coupled to the rails 14 and 14' as shown by broken line in FIG. 11A so that the frame 3a is prevented from tipping over. The horizontal length of the adaptors 15 and 15' is selected to be smaller than the dimension L of the cable space between the frame 3a and the wall of the container 3. Therefore, the size of the frame 3a need not be increased.

In this manner, since the length of the rails is selected to be substantially equal to the width of the frame in the direction of draw and the adaptors to be coupled to the rails are attached at the upper and lower ends on the side of the frame opposite to the draw side, the frame does not fall when it is drawn, the upper rail 14' does not block the illumination by the room light 12 and hence does not cause underillumination, and the lower rail 12' does not extend on the floor between opposing frames preventing damage of the rail and accident by the attendant which would otherwise be caused the attendant's striking against the rail and improving the operability and the safety.

When it is not desired to arrange the frames on both sides of the container in a manner to allow draw thereof as shown in FIG. 11A but it is desired to arrange the frames such that the frames on one side are pivotable, the prior art construction in which the rails extend into the operation space prevents the movement of the pivotable frames rendering the accomplishment of the construction impossible or reducing the packing density. On the other hand, the construction of FIG. 11A allows the accomplishment of the construction or can improve the packing density.

Figure 12:
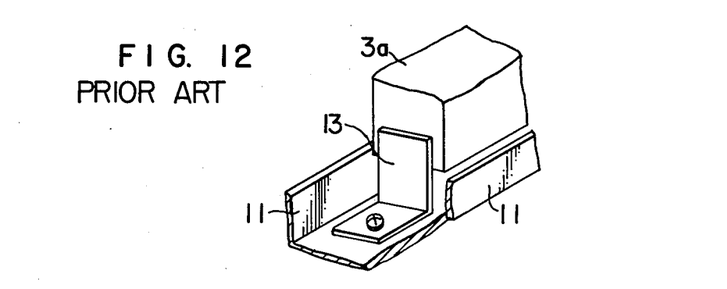
FIG. 12 is a perspective view illustrating a stopper structure of a prior art frame.

In the prior art apparatus, when the frames 3a are accommodated, stoppers 13 are attached to the rails 11 by bolts or the like as shown in FIG. 12 to prevent the movement of the frames 3a. With such stopper structure, however, since the rails 11 extend to the walking area of the attendant, the attendant may strike against the rail when he walks. This results in the damage of the rail, poor operability and possible accident of the attendant.

Figure 13A:
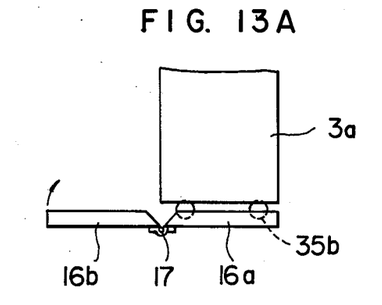
FIGS. 13A and 13B are front view and perspective view, respectively, of one embodiment of a stopper structure in the present invention, in a transportable position of the frame and in a constrained position of the frame, respectively.
Figure 13B:
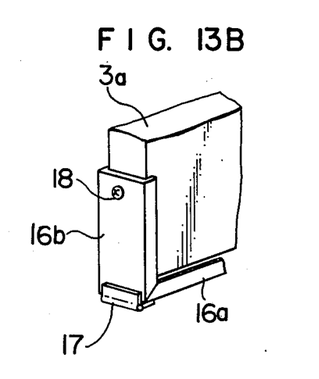

As shown in FIG. 13A, according to the present invention, the rail is divided into two segments 16a and 16b which are connected together by a connecting member such as a hinge 17 so that one of the rail segments is pivotable. Thus, when the frame 3 is to be housed and fixed, the rail segment 16b on the draw side is pivoted as shown in FIG. 13B and the rail segment 16b is fixed to the frame 3 by a fastening member 18 such as a bolt.

Thus, according to the present invention, since the rail is divided into two sections with one of them being pivotable, which is then fixed to the frame to prevent the movement of the frame, the rail does not extend into the operation space when the frame is not drawn. Accordingly, the damage of the rail and the accident of the attendant which would otherwise be caused by the attendant's striking against the rail are prevented and the operability and the safety of operation are improved.

Furthermore, when the frames are to be arranged such that the frames on one side of the container can be drawn and the frames on the other side are pivotable, the rails for the drawing type frames do not block the movement of the pivotable frames, which was a problem encountered in FIG. 11. Accordingly, higher packing density is attained.

Figure 6:
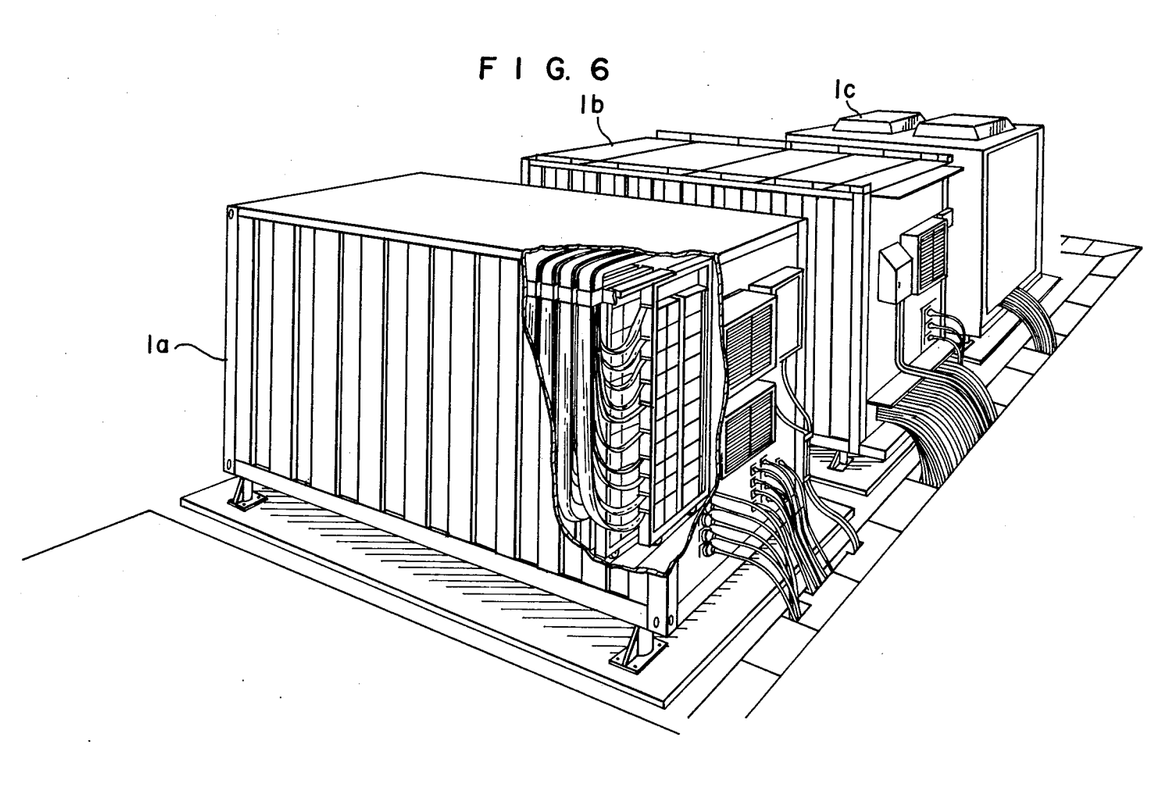
FIG. 6 is a perspective view, partly broken away, of a transportable telephone exchange apparatus according to the present invention.
Figure 7B:
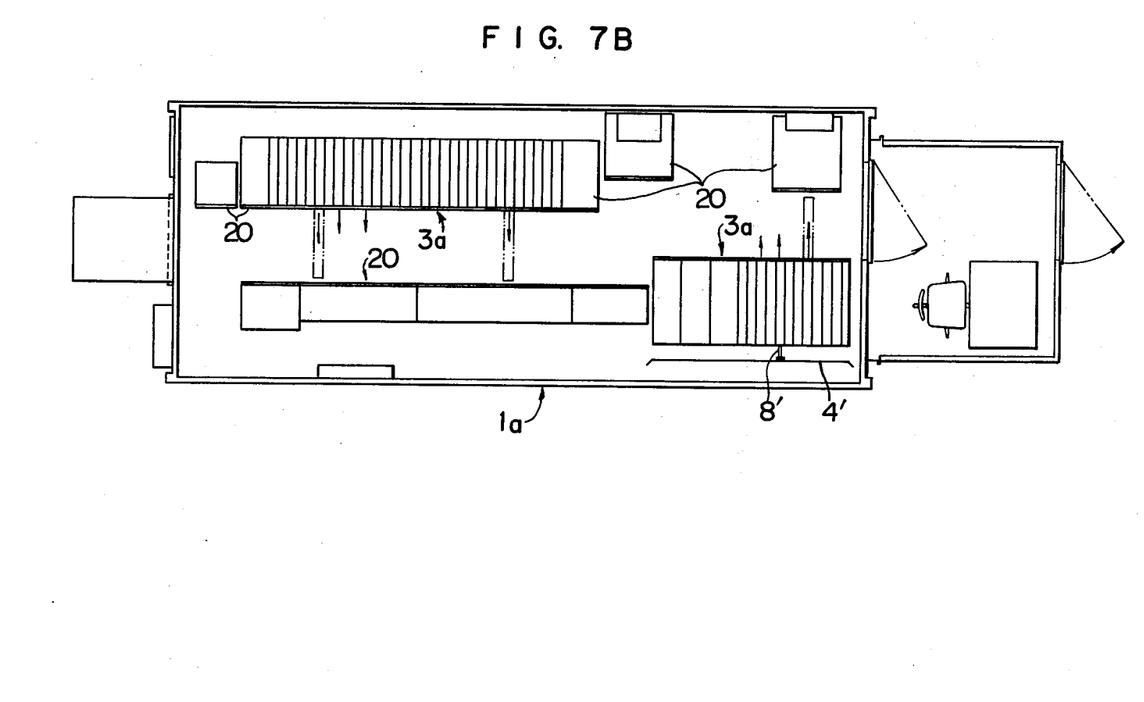
FIG. 7B is a plan view with a ceiling of the transportable container being cut away, illustrating arrangement of frames within the container.

FIGS. 7A and 7B show the arrangement of the movable frames 3a and the stationary frames 20 in the container 3 in accordance with the present invention. Containers 1a to 1c constitute an automatic exchange apparatus as shown in FIG. 6.

Figure 5:
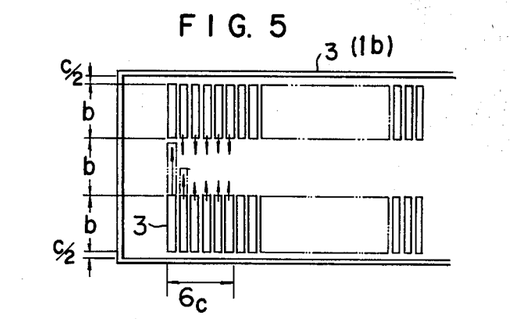
FIG. 5 shows arrangement of the frames within the container with a top of the container being cut away along the line II—II in FIG. 1, illustrating a basic concept of the present invention.

According to the present invention, in order to attain higher packing density than in the prior art, the frames 3a having drawing mechanisms and including electronic instruments are arranged in the container 1 with the frames 3a opposing in the direction of draw as shown in FIGS. 5 and 7B. The spacing b which allows the accommodation of one of the frames when it is drawn is provided (FIG. 5).

The spacing c/2 (FIG. 5) between the draw type frame and the inner wall of the container 1 is used to accommodate the movable cables and the spacing b after the draw type frame 3a is drawn is a space in which the cables can be moved. The space between the opposite banks of frams 3a serves as a maintenance space and has a width b to accommodate the drawn frames.

Since the width for 12 draw type frames 3a in FIG. 5, that is, the spacing 12c is approximately one half of the width for 12 pivotable frames in FIG. 4, that is, the spacing $L3\times(b+6c)=(2b+c)\times(b+6c)$, the packing density is doubled. This packing density is about three times as high as that in FIG. 3.

Figures 14A, 14B, 15:
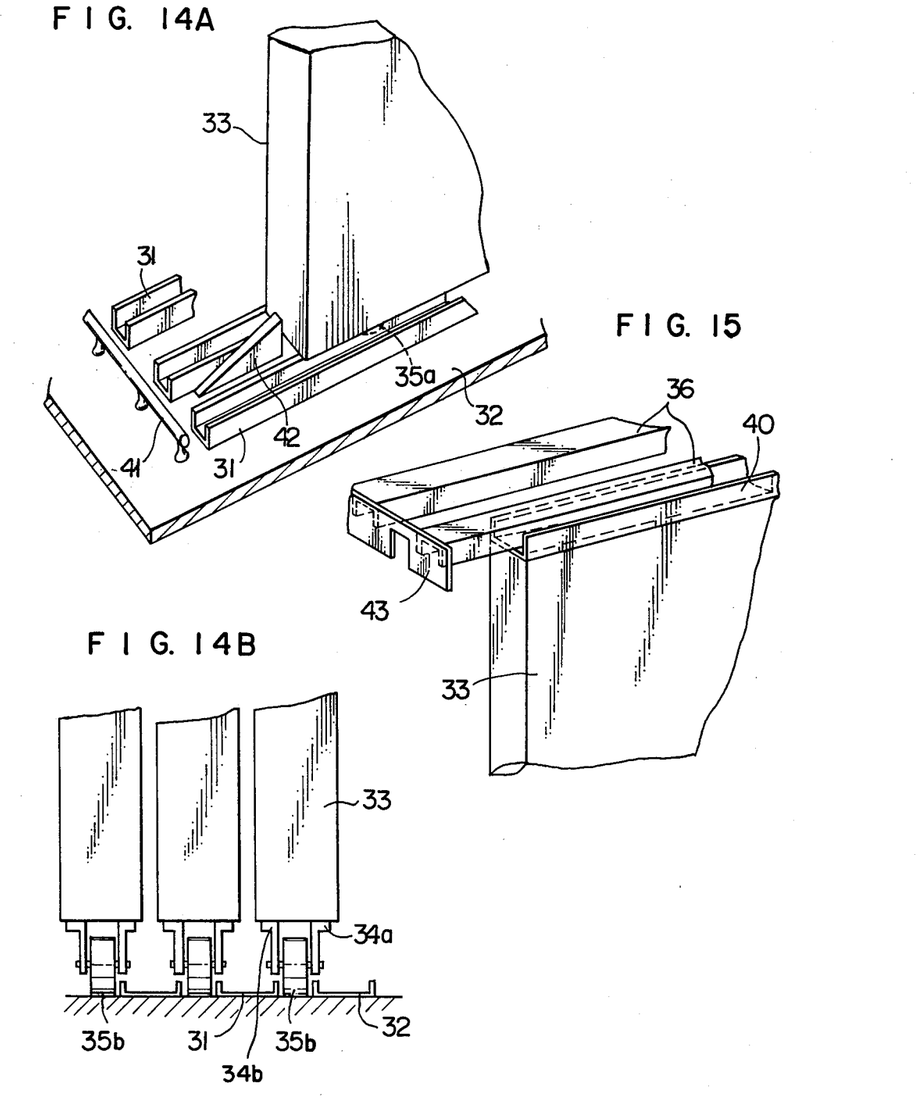
FIGS. 14A and 14B are perspective view and side elevational view, respectively, of a major portion illustrating engagement of a movable frame and a lower rail.
FIG. 15 is a perspective view of a major portion illustrating engagement of the movable frame and an upper rail.

FIGS. 14A and 14B and FIG. 15 show a particular embodiment illustrating relations between the movable frame 33 and the rails 14 and 14′ shown in FIG. 11.

As shown in FIGS. 14A and 14B, channel shape steel channels forming lower rails 31 are fixed on the floor at an interval equal to the lateral width of the movable frame 33, and wheels 35a and 35b attached at the bottom of the frames through brackets 34a and 34b fixed on the bottom are positioned between the rails to define the direction of draw of the frame. The upper rails 36 in the form of steel channels having a width which is approximately equal to the width of the frame are fixed to pairs of horizontal mounts not shown, which are fixed to the ceiling of the container, at an interval slightly larger than the width of the frame, as shown in FIG. 5. Pairs of vertical plates of steel channel 40 having a width equal to the width of the frame and attached to the tops of the frames are positioned in the spacings formed between the steel channel forming the upper rails 36, with each of the vertical plates of one steel channel being paired with one of the vertical plates of an adjacent steel channel. In this manner, the vertical plates guide the frame at the top thereof when it is drawn. The upper rails depend from the ceiling and are also fixed to a side wall 39 and they also serve as a cable rack for the accommodating cables 8 connected to the movable frames in a space between the ceiling and the frames.

A stop hardware 41 for stopping the frames 33 at a predetermined position is formed near the ends of the lower rails 31 facing the side wall between the steel channels forming the rails, and wedge shaped engagement members 42 are attached to the rear corners of the movable frames such that the movement of the frames is stopped by the engagement of the members 42 with the stop hardware 41.

When the movable frame 33 is drawn, the rear wheel 35a attached at the bottom of the frame is on the rail 31 but the front wheel 35b is beyond the lower rail 31. However, by the structure of the upper rails 36, the direction of draw is defined. A comb shaped stop plate 43 is fixed on the front ends of the steel channels forming the upper rails 36, and engagement members (not shown) which are to abut against the stop plate 43 are attached to the rear portions of the steel channels 40 fixed to the tops of the movable frames, to define the amount of draw.

Threaded bores (not shown) for mounting a movement blocking plate for preventing the movement of the movable frames only during the movement of the container are formed in the stop plate 43 and at the tops of the front ends of the movable frames 33. Similar threaded bores for mounting the movement blocking plate are also formed at the front lower ends of the movable frames 33 and in the floor 32.

Figure 16A:
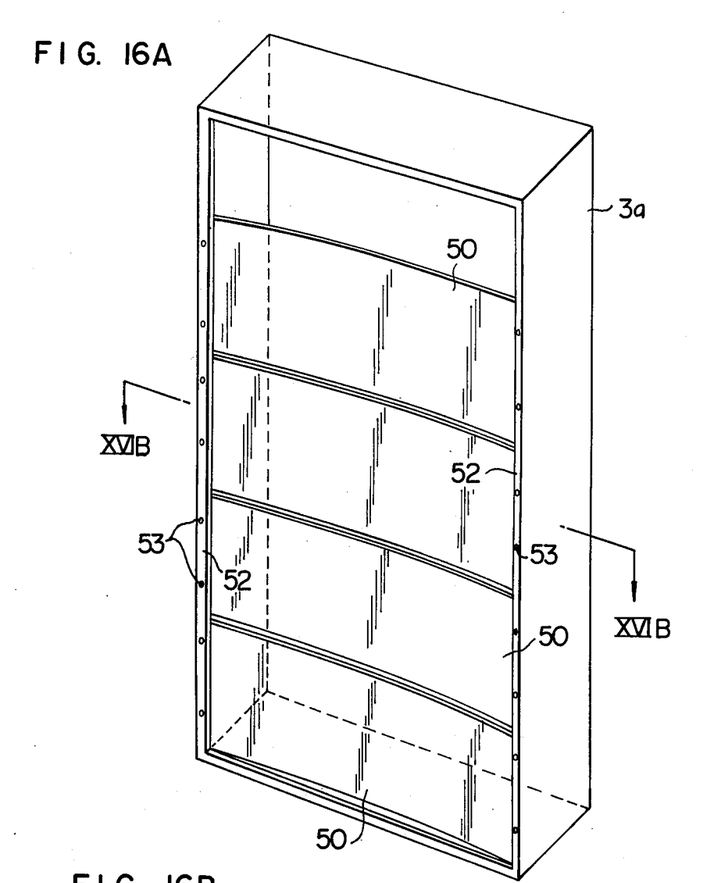
FIGS. 16A and 16B are perspective and sectional views of a wiring depressing plate mounted in the frame.
Figure 16B:
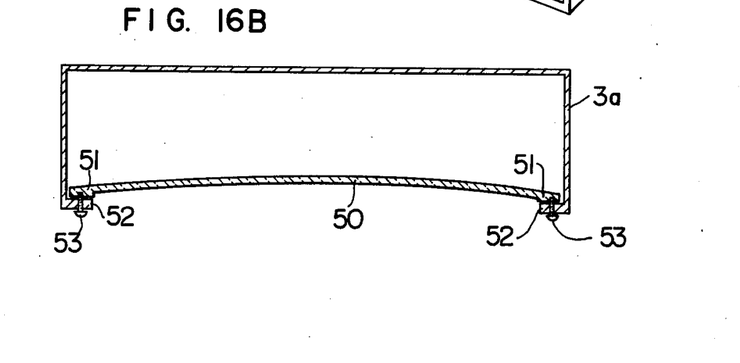

Referring to FIGS. 16A and 16B, each of the movable frames 3a may have plural plates 50 for depressing the wirings (not shown) connected between many devices located in each frame 3a in order to prevent jamming of the wiring located between the frames 3a, thereby to achieve a smooth movement of the frame free from the jamming. As shown in FIG. 16B, the plate 50 has a thickened portion 51 at both ends thereof for making the plate 50 curve inwardly to be able to depress the wirings, when the both ends of the plate 50 are fixed at the protrusions 52 for supporting the ends by fasteners such as screws 53. The plate 50 may preferably be made of a transparent plastic material.

What is claimed is:

1. A transportable telephone exchange apparatus comprising:
   a generally box-like container casing having a ceiling, a floor, and side walls,
   a first group of frames disposed along one of said side walls and being movable in a direction perpendicular to said one side wall, each of said frames being capable of accommodating electrical devices,
   a second group of frames disposed along an opposite side wall of the container, each of said frames of said second group being capable of accommodating electrical devices,
   maintenance space provided between said first and second groups of frames, said maintenance space having a width which is substantially equal to a length of each of said first group of frames in the moving direction thereof, and
   lower rails supporting the lower ends of the frames to guide each said frame in its moving direction, each of said lower rails being divided into two segments which are connected so as to be pivotable at the connecting point by a connecting member, one of said segments being pivotable toward an edge of the frame for attachment to the frame when the frame is supported by the other segment in order to prevent movement of the frame and being extensible to a position in line with said other segment in order to guide said frame for movement into said maintenance space.

2. A transportable telephone exchange apparatus according to claim 1 wherein cables with first connectors are supported on said one side wall of said container, and further including a plurality of external connection wires having second connectors at the ends thereof and having sufficient length to allow movement of the frame extending from the sides of said frames which face said one side wall, said first connectors of said cables and said second connectors of said external connection wires being connectable to each other.

3. A transportable telephone exchange apparatus as provided in claim 1 wherein said second group of frames is stationary.

4. A transportable telephone exchange apparatus as provided in claim 1, wherein each of said second group of frames is movable in a direction perpendicular to said opposite side wall.

5. A transportable telephone exchange apparatus as provided in claim 1 which further comprises upper rails supporting each of said frames at the upper end of each frame to guide each said frame in its moving direction, the length of said rails being substantially equal to the width of the frame, and wherein each of said frames has an adaptor provided at the upper end of the frame and projecting to the back of the frame, the adaptor being coupled to the rail when the frame is moved into said maintenance space so as to prevent the frame from tipping.

6. A transportable telephone exchange apparatus according to claim 1 further comprising upper rails for guiding said movable frames, a channel-shaped member mounted at the top end of each of said movable frames for engagement with said upper rails, said upper rails guiding said movable frames in cooperation with said lower rails, and wheels mounted rotatably at the bottom end of each of said movable frames, said wheels traveling a moving path defined by said lower rails.

7. A transportable telephone exchange apparatus according to claim 1 wherein each of said movable frames has a plurality of plates curved inwardly for inwardly depressing wirings connected between the devices located in each frame.

8. A transportable telephone exchange apparatus as provided in claim 1 wherein said movable frames are of rectangular shape and disposed in parallel planes transverse to said one side wall in spaced relationship therewith, and further including a plurality of cables supported along said one side wall, each cable being connectable by way of a conductor loop to a selected frame so as to permit movement of said frame into and out of said maintenance space.

9. A transportable telephone exchange apparatus comprising:
a generally box-like container casing having a ceiling, a floor, and side walls,
a first group of frames disposed along one of said side walls and being movable in a direction perpendicular to said one side wall, each of said frames being capable of accommodating electrical devices,
a second group of frames disposed along an opposite side wall of the container, each of said frames of said second group being capable of accommodating electrical devices,
a maintenance space provided between said first and second groups of frames, said maintenance space having a width which is substantially equal to a length of each of said first group of frames in the moving direction thereof,
upper rails for guiding said movable frames,
a channel-shaped member mounted at the top of each of said movable frames for engagement with said upper rails,
lower rails mounted on the floor of said container for guiding said movable frames in cooperation with said upper rails,
wheels mounted rotatably at the bottom end of each of said movable frames, said wheels traveling in a moving path defined by said lower rails,
a first stop member mounted on the end of said upper rails to stop said movable frame,
a second stop member mounted on the floor of said container, and
a wedge-shaped member mounted on the rear corners of said each movable frame for being engaged with said second stop member, the position of said first and second stop members being provided so as to keep a predetermined distance between a back end of each movable frame and the adjacent side wall when said first and second stop members are in engagement with the end of said channel-shaped member and said wedge-shaped member, respectively.

10. A transportable telephone exchange apparatus as provided in claim 9, wherein said second group of frames is stationary.

11. A transportable telephone exchange apparatus as provided in claim 10, wherein each of said second group of frames is movable in a direction perpendicular to said opposite side wall.

12. A transportable telephone exchange apparatus according to claim 9, wherein cables with first connectors are supported on said one side wall of said container, and further including a plurality of external connection wires having second connectors at the ends thereof and having sufficient length to allow movement of the frame extending from the sides of said frames which face said one side wall, said first connectors of said cables and said second connectors of said external connection wires being connectible to each other.

* * * * *